(12) United States Patent
Li et al.

(10) Patent No.: US 12,112,961 B2
(45) Date of Patent: Oct. 8, 2024

(54) SUBSTRATE PROCESSING SYSTEM, LOAD PORT AND METHOD

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Chuang Li, Hsinchu (TW); Honghua Zhu, Hsinchu (TW)

(73) Assignees: TAIWAN SEMICONDUCTOR MANUFACTURING COMPANY, LTD., Hsinchu (TW); TSMC CHINA COMPANY, LIMITED, Shenzhen (CN)

( * ) Notice: Subject to any disclaimer, the term of this patent is extended or adjusted under 35 U.S.C. 154(b) by 842 days.

(21) Appl. No.: 17/174,991

(22) Filed: Feb. 12, 2021

(65) Prior Publication Data

US 2022/0246455 A1    Aug. 4, 2022

(30) Foreign Application Priority Data

Feb. 1, 2021    (CN) .......................... 202110135535.X

(51) Int. Cl.
*H01L 21/67*    (2006.01)
*F26B 11/02*    (2006.01)
(Continued)

(52) U.S. Cl.
CPC ...... *H01L 21/67259* (2013.01); *F26B 11/026* (2013.01); *G01G 1/00* (2013.01);
(Continued)

(58) Field of Classification Search
CPC ............. F26B 11/026; H01L 21/67259; H01L 21/67034; H01L 21/67778;
(Continued)

(56) References Cited

U.S. PATENT DOCUMENTS 5,577,331 A    11/1996    Suzuki
7,260,442 B2    8/2007    Hwang et al.
(Continued)

FOREIGN PATENT DOCUMENTS

CN    208269518    12/2018
JP    H0661211 A  *  3/1994
(Continued)

OTHER PUBLICATIONS

Translation JP-H0661211-A (Year: 1994).*

*Primary Examiner* — Jessica Yuen
(74) *Attorney, Agent, or Firm* — Hauptman Ham, LLP

(57) ABSTRACT

A system includes at least one sensor and at least one controller. The at least one sensor is configured to generate a first weight signal corresponding to a first weight of a first lot of substrates, and a second weight signal corresponding to a second weight of a second lot of substrates. The at least one controller is coupled to the at least one sensor to receive the first weight signal and the second weight signal. The at least one controller is configured to convert a weight difference between the first weight and the second weight into a number of substrates each having a predetermined weight. The at least one controller is further configured to, based on the converted number of substrates, control a processing apparatus to rotate the first lot of substrates and the second lot of substrates simultaneously.

20 Claims, 6 Drawing Sheets

(51) Int. Cl.
  *G01G 1/00* (2006.01)
  *G01G 19/62* (2006.01)
  *H01L 21/677* (2006.01)
  *H01L 21/687* (2006.01)

(52) U.S. Cl.
  CPC ....... *G01G 19/62* (2013.01); *H01L 21/67034* (2013.01); *H01L 21/67778* (2013.01); *H01L 21/68764* (2013.01); *H01L 21/68771* (2013.01)

(58) Field of Classification Search
  CPC ......... H01L 21/68764; H01L 21/68771; H01L 21/67253; H01L 21/02; G01G 1/00; G01G 19/62
  See application file for complete search history.

(56) References Cited

U.S. PATENT DOCUMENTS

| | | |
|---|---|---|
| 9,256,709 B2 | 2/2016 | Yu et al. |
| 2014/0040838 A1 | 2/2014 | Liu et al. |
| 2015/0227671 A1 | 8/2015 | Yu et al. |
| 2015/0278429 A1 | 10/2015 | Chang |

FOREIGN PATENT DOCUMENTS

| | | |
|---|---|---|
| JP | H06188234 | 7/1994 |
| JP | H09223683 | 8/1997 |
| TW | 200938794 | 9/2009 |
| TW | 201628081 | 8/2016 |
| TW | 201921553 | 6/2019 |

\* cited by examiner

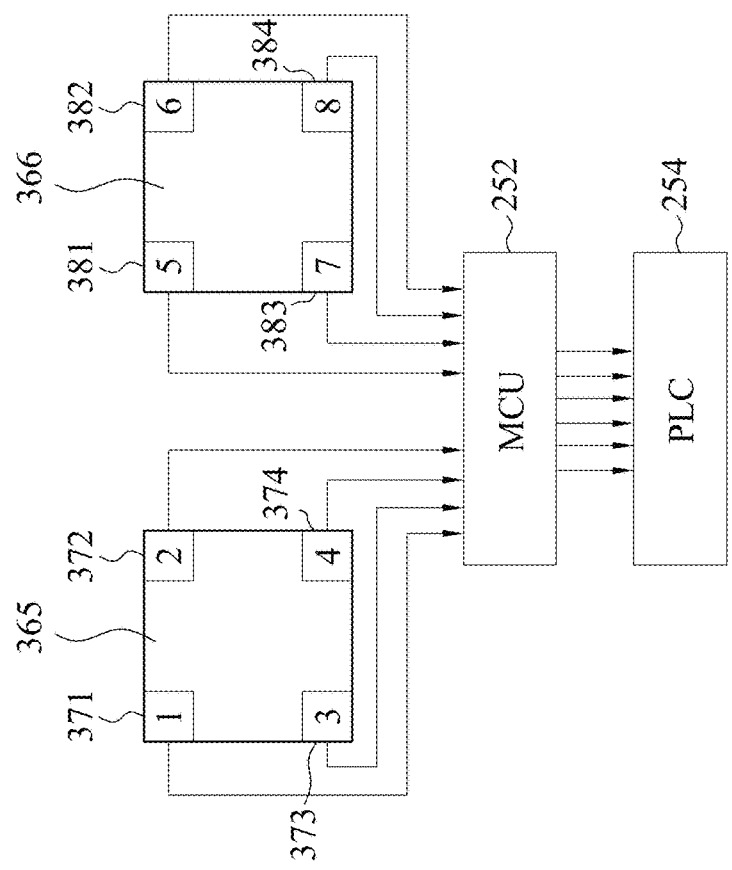
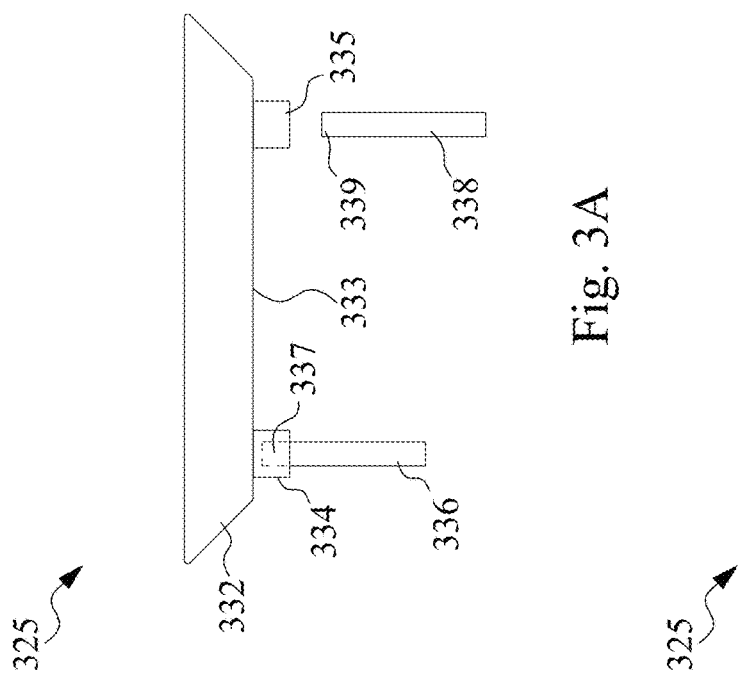
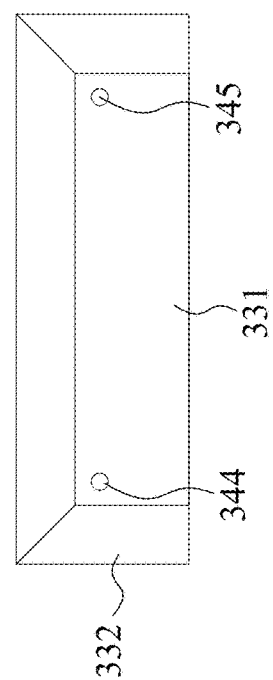

SUBSTRATE PROCESSING SYSTEM, LOAD PORT AND METHOD

BACKGROUND

Integrated circuits (ICs) are used in various electronic devices, such as computers, cameras, cell phones, tablets, or the like. ICs are typically manufactured on wafers by a series of processing steps, such as material deposition, patterning, etching, cleaning, drying, singulating, or the like. In some applications, IC manufacturing steps include a wet cleaning which involves dipping wafers to be cleaned into a liquid to remove contamination. After the wet cleaning, the cleaned wafers are mounted in a rotational drying apparatus, referred to herein as "spin dryer," and are rotated by the spin dryer at high speed to remove the liquid remaining on the cleaned wafers by centrifugal force. Rotational balancing of the spin dryer and/or the wafers mounted therein during such a high speed rotation is a consideration in the IC manufacturing process and/or equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic side view of a cassette support, in accordance with some embodiments.

FIG. 3B is a schematic, partial top view of the cassette support in FIG. 3A, in accordance with some embodiments.

FIG. 3C is a schematic view of a sensor arrangement on cassette supports together with corresponding controllers, in accordance with some embodiments.

DETAILED DESCRIPTION

Figure 1:
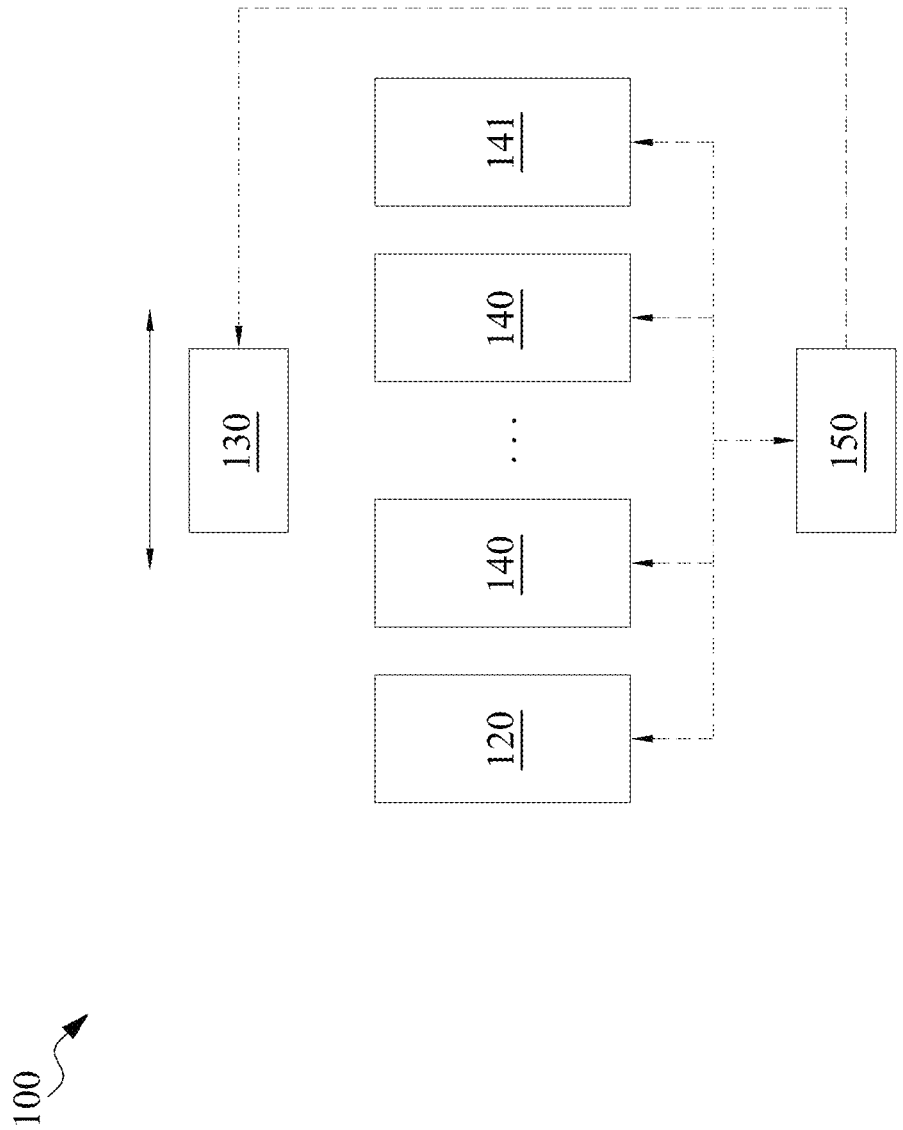
FIG. 1 is a schematic view of a wafer processing system, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, at least one sensor is used to detect a weight difference between different lots of wafers to be mounted in a spin dryer. The weight difference is converted into a number of wafers each having a predetermined wafer weight. The converted number of wafers is input into a controller of the spin dryer. The controller uses the input number of wafers to control a balancing mechanism of the spin dryer, for achieving rotational balancing when the different lots of wafers are simultaneously rotated or spun in the spin dryer. Because the number of wafers input into the controller of the spin dryer is converted from the weight difference between the lots of wafers to be spun, the weight distribution inside the spin dryer is accurately reflected, resulting in improved rotational balancing during the spinning operation of the spin dryer in at least one embodiment. In other approaches, one or more numbers of wafers input into the controller of a spin dryer reflect a difference in the number, rather than in the weight, of wafers in different lots of wafers to be spun. As a result, when the lots of wafers to be spun include wafers of different wafer weights, there is a possibility that the number of wafers input into the controller of the spin dryer in the other approaches does not accurately reflect a distribution of weights inside the spin dryer, resulting in a risk of rotational unbalancing, alarms, or stoppage of the manufacturing process. At least one embodiment described herein makes it possible to avoid such disadvantage of the other approaches.

FIG. 1 is a schematic view of a wafer processing system 100, in accordance with some embodiments. The wafer processing system 100 comprises a load port 120, a robot 130, a plurality of processing apparatuses 140, 141, and a controller 150. In some embodiments, the wafer processing system 100 is a wet bench tool.

The load port 120 is configured to load or transfer wafers into the wafer processing system 100 for processing by one or more of the processing apparatuses 140, 141. In the example configuration in FIG. 1, the load port 120 is also configured to unload or transfer the wafers, after being processed by one or more of the processing apparatuses 140, 141, from the wafer processing system 100. In another example, the wafer processing system 100 further comprises a separate unload port (not shown) to unload the processed wafers. In at least one embodiment, a batch or lot of wafers is contained in a cassette which is loaded into the load port 120.

The robot 130 is configured to transfer the loaded wafers from the load port 120 to and sequentially through one or more of the processing apparatuses 140, 141. In at least one embodiment, the wafer processing system 100 comprises more than one robot 130 and/or more than one load port 120.

The processing apparatuses 140, 141 are configured to perform, on the transferred wafers, one or more of processes or treatments, such as plasma processes, Chemical Vapor Deposition (CVD), Atomic Layer Deposition (ALD), Physical Vapor Deposition (PVD), annealing, etching, degassing, pre-cleaning, cleaning, post-cleaning, drying, or the like. The processing apparatuses 140, 141 comprise a spin dryer 141 configured to remove liquid or other contamination from wafers, by spinning the wafers as described herein. In the example configuration in FIG. 1, the processing apparatuses 140, 141 are arranged along a straight row. Other configurations are within the scope of various embodiments.

The controller 150 is coupled to the load port 120, robot 130, and processing apparatuses 140, 141, and is configured to control wafer loading, transfer, processing and unloading. Although FIG. 1 illustrates one controller 150, one or more further controllers (not shown) are included in the wafer processing system 100 in at least one embodiment. Each of such further controllers is dedicated to control one or more of the load port 120, robot 130, processing apparatuses 140, 141, in cooperation with or under control of the controller 150. For example, each of the load port 120 and the spin dryer 141 has a dedicated controller, as described herein. In one or more embodiments, a controller of the wafer processing system 100 comprises a hardware platform, such as a processor or a chip coupled with a memory, which is programmable by software and/or firmware to perform one or more functions, operations or processes described herein. In some embodiments, a controller of the wafer processing system 100 comprises a dedicated hardware circuit, e.g., in the form of an application-specific integrated circuit (ASIC) hardwired to perform one or more functions, operations or processes described herein. A further example hardware configuration of a controller of the wafer processing system 100 is described with respect to FIG. 5.

Figure 2:
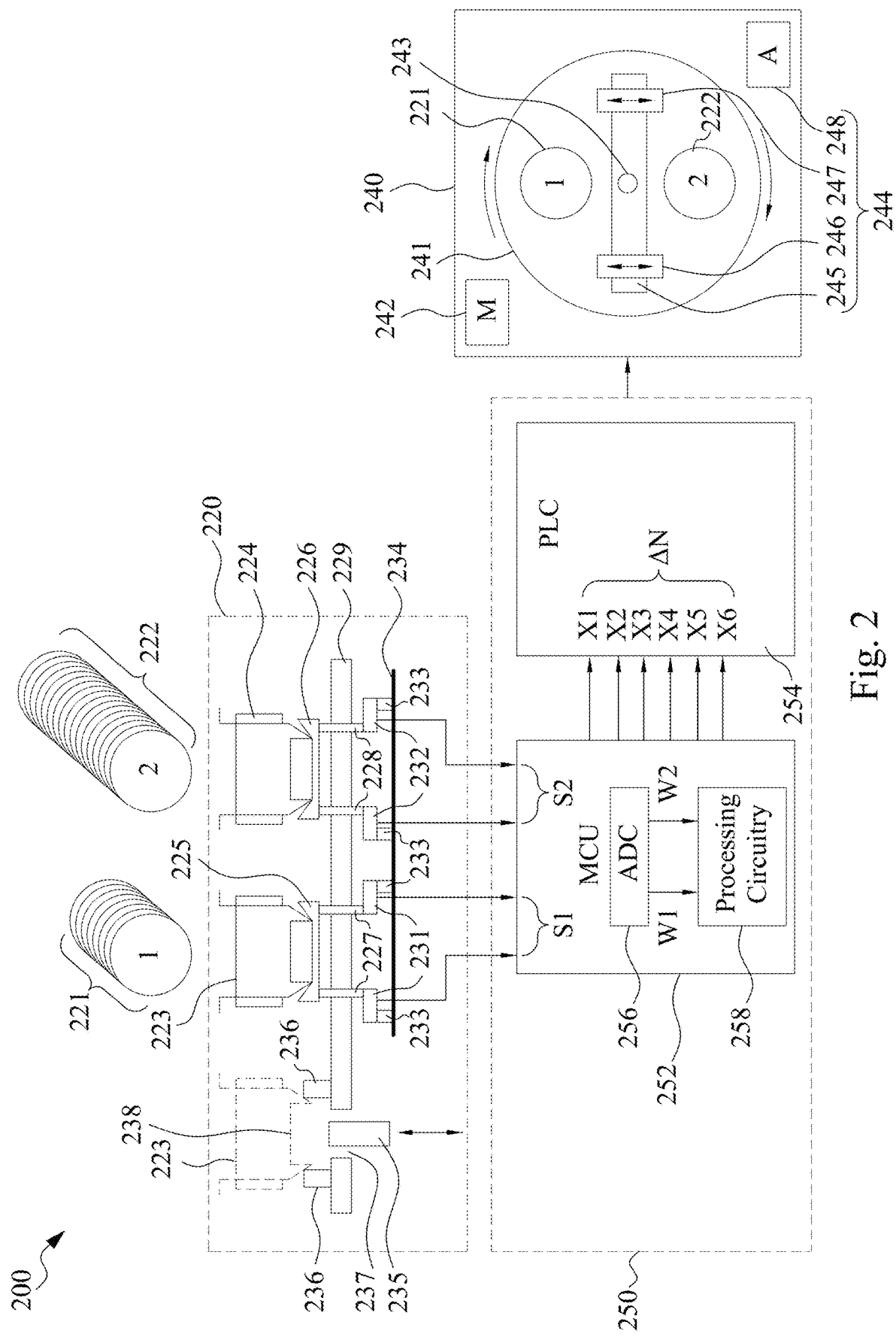
FIG. 2 is a schematic view of a substrate processing system, in accordance with some embodiments.

FIG. 2 is a schematic view of a substrate processing system 200, in accordance with some embodiments. The substrate processing system 200 comprises a load section 220 for receiving substrates, a processing apparatus 240 for rotating or spinning the substrates, and a controller 250 for controlling at least one of the load section 220 or processing apparatus 240. In some embodiments, the substrates to be processed or handled by the substrate processing system 200 are wafers. For example, the substrate processing system 200 corresponds to the wafer processing system 100, the load section 220 corresponds to the load port 120, the processing apparatus 240 corresponds to the spin dryer 141, and the controller 250 corresponds to one or more controllers of the wafer processing system 100. However, in various embodiments, the substrate processing system 200 is configured to process or handle substrates other than wafers. For simplicity, in some embodiments described herein below, the substrates to be processed or handled by the substrate processing system 200 are wafers, unless otherwise indicated.

The load section 220 is configured to receive a first lot of wafers 221 and a second lot of wafers 222. The first lot of wafers 221 is contained in a first cassette 223, and the second lot of wafers 222 is contained in a second cassette 224. Although the first lot of wafers 221 is shown for illustrating purposes to be outside the first cassette 223 in FIG. 2, the first lot of wafers 221 is contained in the first cassette 223 and arranged along an axis that is perpendicular to the plane of FIG. 2 when the first lot of wafers 221 is delivered to the load section 220. Likewise, the second lot of wafers 222 is contained in the second cassette 224 and arranged along an axis that is perpendicular to the plane of FIG. 2 when the second lot of wafers 222 is delivered to the load section 220.

The load section 220 comprises a first cassette support 225, a second cassette support 226, a plurality of first rods 227, a plurality of second rods 228, a platform 229, a plurality of first sensors 231 corresponding to the first rods 227, a plurality of second sensors 232 corresponding to the second rods 228, a plurality of sensor supports 233, and a further platform 234. The first cassette support 225 is configured to support thereon the first cassette 223 containing the first lot of wafers 221. The second cassette support 226 is configured to support thereon the second cassette 224 containing the second lot of wafers 222.

Each of the first rods 227 extends downwardly from a bottom of the first cassette support 225, through the platform 229, to rest on an end of the corresponding first sensor 231. An opposite end of the corresponding first sensor 231 is supported from below by a corresponding one of the sensor supports 233 on the further platform 234. The first rods 227 are configured to transfer a first load corresponding to a first total weight of the first cassette 223 and the first lot of wafers 221 to the first sensors 231. The first load applied from the first rods 227 cause the first sensors 231 to deform and generate a first weight signal S1 corresponding to the first total weight.

Each of the second rods 228 extends downwardly from a bottom of the second cassette support 226, through the platform 229, to rest on an end of the corresponding second sensors 232. An opposite end of the corresponding second sensors 232 is supported from below by a corresponding one of the sensor supports 233 on the further platform 234. The second rods 228 are configured to transfer a second load corresponding to a second total weight of the second cassette 224 and the second lot of wafers 222 to the second sensors 232. The second load applied from the second rods 228 cause the second sensors 232 to deform and generate a second weight signal S2 corresponding to the second total weight. Examples of the first sensors 231 and/or the second sensors 232 include, but are not limited to, pressure sensors, weight sensors, force sensors, strain gauges, load cells, piezoelectric sensors, fiber optic sensors, capacitive sensors or the like.

The described extension of the first rods 227 and the second rods 228 through the platform 229 ensures stable movement of the first rods 227 and second rods 228 and/or reliable load transfer to the first sensors 231 and second sensors 232. However, other arrangements for load transfer to the first sensors 231 and/or the second sensors 232 are within the scopes of various embodiments. Further, the described arrangement of the first rods 227 and the second rods 228 on one side and the sensor supports 233 on the opposite side for causing deformation of the first sensors 231 and second sensors 232 is an example, and other arrangements for causing deformation of the first sensors 231 and/or the second sensors 232 are within the scope of various embodiments.

In at least one embodiment, it is sufficient for the load section 220 to include a single first sensor 231 for generating the first weight signal S1, and/or a single second sensor 232 for generating the second weight signal S2. In some embodiments, it is sufficient for the load section 220 to include a single cassette support, such as the first cassette support 225 with the corresponding one or more first sensors 231, for generating both the first weight signal S1 and the second weight signal S2. For example, the first cassette 223 with the first lot of wafers 221 contained therein is placed first on the first cassette support 225 to cause the one or more first sensors 231 to generate the first weight signal S1, then the first cassette 223 is removed from the first cassette support 225, and the second cassette 224 with the second lot of wafers 222 is placed on the first cassette support 225 to cause the one or more first sensors 231 to generate the second weight signal S2.

In at least one embodiment, the load section 220 further comprises a wafer counter 235 for counting a number of wafers in the first lot of wafers 221 and/or the second lot of wafers 222. For example, as indicated by dot-dot lines in FIG. 2, before or after weighting the first lot of wafers 221 and the first cassette 223 by the first sensors 231, the first cassette 223 with the first lot of wafers 221 contained therein is supported on supports 236 on the platform 229. The wafer counter 235 is raised upwardly through an opening 237 in the platform 229 to access the wafers in the first lot of wafers 221 which are exposed via an opening 238 on a bottom of the first cassette 223. The wafer counter 235 is moved along the axis in which the wafers in the first lot of wafers 221 are arranged, i.e., perpendicularly to the plane of FIG. 2, to count the number of the wafers in the first lot of wafers 221. After counting, the wafer counter 235 is retracted downwardly. An example configuration of the wafer counter 235 includes a light source and a light sensor. Every time light generated by the light source is blocked by a wafer and becomes undetected by the light sensor, the wafer is counted. Although the wafer number counted by the wafer counter 235 is not used for controlling or achieving rotational balancing in the processing apparatus 240 in accordance with at least one embodiment, the counted wafer number is usable for other processing apparatuses of the substrate processing system 200. In at least one embodiment, the wafer counter 235 is omitted.

As described herein, in at least one embodiment, the load section 220 corresponds to the load port 120, and the described components of the load section 220 are included in the load port 120. In at least one embodiment, the load section 220 is included in a processing apparatus other than the load port 120. In at least one embodiment, the load section 220 is included in the processing apparatus 240 or the spin dryer 141. In at least one embodiment, the load section 220 is configured in a separate apparatus which is neither a load port nor a processing apparatus of a wafer processing system.

The processing apparatus 240 is configured to simultaneously rotate or spin the first lot of wafers 221 and the second lot of wafers 222 when the lots of wafers are mounted in the processing apparatus 240. In at least one embodiment, the processing apparatus 240 is a spin dryer, such as the spin dryer 141. However, applications of the processing apparatus 240 other than for drying wafers are within the scopes of various embodiments. For example, in at least one embodiment, the processing apparatus 240 is configured for any application that involves simultaneous rotation of multiple lots of substrates while achieving rotational balancing of such rotation. For simplicity, in some embodiments described herein below, the processing apparatus 240 is referred to as spin dryer 240.

The spin dryer 240 comprises a frame (or turntable) 241, a motor 242 configured to rotate the frame 241 around a rotational axis 243, and a balancing mechanism 244. The frame 241 is configured to support and secure wafers to be spun. For example, after the described weighing operation at the load section 220, a robot, such as the robot 130, removes the first lot of wafers 221 from the first cassette 223 and transfers the first lot of wafers 221 to a corresponding location (indicated with the number "1") on the frame 241. Similarly, the robot removes the second lot of wafers 222 from the second cassette 224 and transfers the second lot of wafers 222 to a corresponding location (indicated with the number "2") on the frame 241. The first lot of wafers 221 and the second lot of wafers 222 are secured to the frame 241, and are to be rotated simultaneously with the frame 241 by the motor 242. However, if one of the first lot of wafers 221 and second lot of wafers 222 is heavier than the other, the rotation of the frame 241 with the lots of wafers thereon becomes unbalanced. Unbalanced rotation potentially causes vibrations, excessive wear, or even failure of the frame 241 and/or other components of the spin dryer 240. To avoid or reduce such issues by achieving rotational balancing of the frame 241 in the spinning operation, the balancing mechanism 244 is provided.

The balancing mechanism 244 comprises an elongated support 245, counterweights 246, 247, and an actuator 248. The elongated support 245 extends across the frame 241, through the rotational axis 243, between and at the same distance from the locations "1" and "2" where the first lot of wafers 221 and the second lot of wafers 222 are to be mounted. The counterweights 246, 247 are mounted on the elongated support 245 to be movable in directions perpendicular to a length of the elongated support 245, as indicated by the double end arrows in FIG. 2. The actuator 248 is configured to move the counterweights 246, 247 under control by a controller, such as the controller 250. Examples of the actuator 248 include, but are not limited to, servomotor, cylinder, or the like. When one of the lots of wafers mounted on the frame 241 is heavier than the other lot, the controller 250 controls the actuator 248 to move the counterweights 246, 247 toward the lighter lot to achieve equal, or substantially equal, weight distributions on opposite sides of the elongated support 245. As a result, the rotation of the frame 241 with the lots of wafers mounted thereon is balanced. Further details of the operation of the spin dryer 240 in accordance with some embodiments are described herein below. The described configuration of the balancing mechanism 244 is an example. Other configurations are within the scope of various embodiments. For example, a single counterweight or more than one counterweights is/are included in a balancing mechanism, in some embodiments. In further embodiments, in addition to or in lieu of the counterweights 246, 247, rotational balancing is achieved by moving the mounting location of at least one of the first lot of wafers 221 or the second lot of wafers 222 toward or away from the rotational axis 243.

The controller 250 comprises a microcontroller (MCU) 252 and a programmable logic controller (PLC) 254. In at least one embodiment, the MCU 252 is a controller dedicated to the load section 220, and the PLC 254 is a controller dedicated to control the spin dryer 240. In some embodiments, the PLC 254 is not configured to directly accept measurement signals from a sensor, and the MCU 252 is configured to serve as an interface between the first sensors 231 and second sensors 232 on one side and the PLC 254 on the other side. The configuration in FIG. 2 where the controller 250 comprises two controllers, i.e., the MCU 252 and the PLC 254, is an example. Other configurations are within the scope of various embodiments. For example, in at least one embodiment, the MCU 252 and PLC 254 are integrated in a single controller, or the controller 250 comprises more than two controllers.

The MCU 252 is coupled to the first sensors 231 and the second sensors 232 to receive the first weight signal S1 and the second weight signal S2. The MCU 252 comprises an analog-to-digital converter (ADC) 256 and processing circuitry 258. In at least one embodiment, each of the ADC 256 and processing circuitry 258 comprises one or more circuits, logic elements, drivers, input/output (I/O) ports, or the like. In at least one embodiment, the MCU 252 is configured in a single chip.

The ADC 256 is configured to convert the first weight signal S1 into first weight data corresponding to the first total weight W1 of a weight Wc1 of the first cassette 223 and a weight Ww1 of the first lot of wafers 221. In other words, W1=Wc1+Ww1. The ADC 256 is further configured to convert the second weight signal S2 into second weight data corresponding to the second total weight W2 of a weight Wc2 of the second cassette 224 and a weight Ww2 of the second lot of wafers 222. In other words, W2=Wc2+Ww2.

The processing circuitry 258 is coupled to the ADC 256 to receive the first total weight W1 and the second total weight W2. The processing circuitry 258 is configured to determine $\Delta W = |W1-W2|$. In some embodiments, with an assumption that the first cassette 223 and the second cassette 224 are similarly configured and have about the same weight, i.e., Wc1=Wc2, then $\Delta W = |W1-W2| = |Ww1-Ww2|$ and $\Delta W$ corresponds to a weight difference between the weight Ww1 of the first lot of wafers 221 and the weight Ww2 of the second lot of wafers 222. The weight difference $\Delta W$ is usable to control and balance a rotation of the first lot of wafers 221 and the second lot of wafers 222 in the spin dryer 240, as described herein.

Specifically, the processing circuitry 258 is configured to convert the weight difference $\Delta W$ between the first lot of wafers 221 and the second lot of wafers 222 into a number of substrates each having a predetermined weight Wn. For example, the processing circuitry 258 is configured to determine $\Delta N = \Delta W/Wn$, where $\Delta N$ is the number of substrates converted from $\Delta W$. In some embodiments, the predetermined weight Wn is a nominal wafer weight of a single wafer, and the spin dryer 240 is configured to spin wafers each having the nominal wafer weight. For example, the predetermined weight Wn is 53 g in some applications. In some situations, the predetermined weight Wn is different from an actual weight of a wafer in the first lot of wafers 221 or in the second lot of wafers 222, and/or the actual weight of a wafer in the first lot of wafers 221 is different from the actual weight of a wafer in the second lot of wafers 222. In such situations, although the converted number of wafers $\Delta N$ reflects the weight difference $\Delta W$, it does not necessarily reflect the difference in the wafer numbers between the first lot of wafers 221 and second lot of wafers 222. In some embodiments, the converted number of wafers $\Delta N$ serves as a way to input the weight difference $\Delta W$ into a controller, e.g., the PLC 254, of the spin dryer 240 for controlling and achieving rotational balancing of the spin dryer 240 in a spinning operation thereof.

In at least one embodiment, the processing circuitry 258 is further configured to round up or down the result of the division $\Delta W/Wn$ to a nearest integer to obtain the converted number of wafers $\Delta N$. The processing circuitry 258 is further configured to output the converted number of wafers $\Delta N$ in the form of a plurality of first bits. In the example configuration in FIG. 2, five first bits X1-X5 are used to express $\Delta N$, for example, as indicated in the table below, in which "0" and blanks indicate logic "0", and "1" indicates logic "1."

| $\Delta N$ | X1 | X2 | X3 | X4 | X5 |
|---|---|---|---|---|---|
| 0 | 0 | 0 | 0 | 0 | 0 |
| 1 |   |   |   |   | 1 |
| 2 |   |   |   | 1 |   |
| 3 |   |   |   | 1 | 1 |
| 4 |   |   | 1 |   |   |
| 5 |   |   | 1 |   | 1 |
| 6 |   |   | 1 | 1 |   |
| 7 |   |   | 1 | 1 | 1 |
| 8 |   | 1 |   |   |   |
| 9 |   | 1 |   |   | 1 |
| 10 |   | 1 |   | 1 |   |
| 11 |   | 1 |   | 1 | 1 |
| 12 |   | 1 | 1 |   |   |
| 13 |   | 1 | 1 |   | 1 |
| 14 |   | 1 | 1 | 1 |   |
| 15 |   | 1 | 1 | 1 | 1 |
| 16 | 1 |   |   |   |   |
| 17 | 1 |   |   |   | 1 |
| 18 | 1 |   |   | 1 |   |
| 19 | 1 |   |   | 1 | 1 |
| 20 | 1 |   | 1 |   |   |
| 21 | 1 |   | 1 |   | 1 |
| 22 | 1 |   | 1 | 1 |   |
| 23 | 1 |   | 1 | 1 | 1 |
| 24 | 1 | 1 |   |   |   |
| 25 | 1 | 1 |   |   | 1 |

The maximum value of $\Delta N=25$ in the above table corresponds to a maximum number of wafers containable in a cassette in some applications. Other arrangements including other numbers of bits and/or other maximum values of $\Delta N$ are within the scope of various embodiments.

The processing circuitry 258 is further configured to output an indicator indicating whether the weight of the first lot of wafers 221 is heavier or lighter than the weight of the second lot of wafers 222. In the example configuration in FIG. 2, a second bit X6 is used as such indicator. A first logic state, e.g., logic "1," of X6 indicates that the first lot of wafers 221 is heavier than the second lot of wafers 222. An opposite, second logic state, e.g., logic "0," of X6 indicates that the first lot of wafers 221 is lighter than the second lot of wafers 222. In an example, the logic state of X6 is generated by the processing circuitry 258 comparing W1 with W2, or based on a sign of the result of the subtraction W1-W2. In at least one embodiment, logic "0" of X1-X6 corresponds to a ground voltage of zero at corresponding output pins of the MCU 252, and logic "1" of X1-X6 corresponds to a voltage of 5V at the corresponding output pins of the MCU 252. Other voltage arrangements are within the scope of various embodiments.

The PLC 254 is coupled to the MCU 252 to receive the converted number of wafers $\Delta N$ and the indicator as to which lot of wafers is heavier, for example, via the plurality of first bits X1-X5 and the second bit X6. The PLC 254 is configured to, based on the received converted number of wafers $\Delta N$ and the indicator as to which lot of wafers is heavier, control the spin dryer 240 to balance a rotation of the first lot of wafers 221 and second lot of wafers 222 simultaneously. In at least one embodiment, the PLC 254 is configured to control the actuator 248 to move the counterweights 246, 247 toward the lighter lot of the first lot of wafers 221 and the second lot of wafers 222. For example, when the indicator, e.g., the second bit X6, indicates that the first lot of wafers 221 at the location "1" on the frame 241 is heavier than the second lot of wafers 222 at the location "2," the PLC 254 is configured to control the actuator 248 to move the counterweights 246, 247 toward second lot of wafers 222. When the indicator indicates that the first lot of wafers 221 at the location "1" on the frame 241 is lighter than the second lot of wafers 222 at the location "2," the PLC 254 is configured to control the actuator 248 to move the counterweights 246, 247 toward the first lot of wafers 221.

The distance which the counterweights 246, 247 are moved from the elongated support 245 toward the lighter lot depends on the received converted number of wafers $\Delta N$ received via the first bits X1-X5. Specifically, $\Delta N$ was converted from and corresponds to the weight difference $\Delta W$ between the first lot of wafers 221 and the second lot of wafers 222. At a higher $\Delta N$, meaning a higher weight difference $\Delta W$, the PLC 254 is configured to control the actuator 248 to move the counterweights 246, 247 farther away from the elongated support 245, i.e., closer to the lighter lot of wafers. At a lower $\Delta N$, meaning a lower weight difference $\Delta W$, the PLC 254 is configured to control the actuator 248 to move the counterweights 246, 247 less distant from the elongated support 245. In at least one embodiment, various values of $\Delta N$ and various corresponding amounts of movement of the counterweights 246, 247 are determined in advance, e.g., by experimentation or simulation, and stored as a look-up table on a computer readable storage medium of, or accessible by, the PLC 254. As a result, equal, or substantially equal, distributions of weight on opposite sides of the elongated support 245 is achieved, resulting in rotational balancing of the spin dryer 240 in the spinning operation.

Other approaches attempt to achieve rotational balancing of a spin dryer by counting the numbers of wafers in different lots of wafers to be spun together, and inputting the counted numbers of wafers into a controller of the spin dryer. The controller of the spin dryer regards a difference in the counted wafer numbers as a difference in weight between the lots, and controls a balancing mechanism of the spin dryer accordingly. The other approaches operate as intended when individual wafers in various lots to be spun have the same predetermined weight, or nominal wafer weight, Wn. However, when individual wafers in different lots have different wafer weights, there is a risk of unbalanced rotation. In an example, both lots of wafers to be spun together have 25 wafers each, but each individual wafer in one lot is heavier than each individual wafer in the other lot. The controller of the spin dryer receives the same counted number (i.e., 25) of wafers in both lots, and considers the two lots to be equal in weight and does not enable the balancing mechanism. As a result the spin dryer operates without the balancing mechanism being enabled even though one lot of wafers is heavier than the other, causing rotational unbalancing with potential alarms, equipment damages and/or stoppage of the manufacturing process.

At least one embodiment described herein makes it possible to avoid disadvantages of the other approaches. Specifically, the converted number of wafers $\Delta N$ input into the PLC 254 corresponds to the weight difference $\Delta W$ between the first lot of wafers 221 and second lot of wafers 222. Therefore, even when the first lot of wafers 221 and second lot of wafers 222 have the same number of wafers but different weights, the PLC 254 still enables the balancing mechanism 244 based on the weight difference $\Delta W$ (represented by the converted number of wafers $\Delta N$) to achieve rotational balancing, instead of disabling the balancing mechanism due to the same wafer number of the lots as in the other approaches. As result, it is possible in some embodiments to achieve one or more advantages including, but not limited to, ensuring rotational balancing at various wafer weights of individual wafers in the lots to be spun together, reducing equipment tear and wear and/or equipment failure, reducing alarms, downtime or stoppage, increasing tool availability, reducing tool impacts on products (e.g., ICs) being manufactured, or the like.

In some situations, due to the rounding up or down of $\Delta W/Wn$ to obtain $\Delta N$, there is an error of a maximum of about one half of Wn or the nominal wafer weight of a single wafer. However, the balancing mechanism 244 in accordance with some embodiments is configured to have an acceptable tolerance of up to one Wn at which rotational balancing is still achievable. Accordingly, it is possible for one or more embodiments to achieve rotational balancing in various situations. At least one embodiment is applicable to spin dryers for rotating and achieving rotational balancing of wafers being manufactured in accordance with various technology generations.

FIG. 3A is a schematic side view of a cassette support 325, in accordance with some embodiments. FIG. 3B is a schematic, partial top view of the cassette support 325 in FIG. 3A, in accordance with some embodiments. In some embodiments, the cassette support 325 corresponds to the first cassette support 225 or the second cassette support 226 in the substrate processing system 200. In some embodiments, the cassette support 325 is included in a load port, such as the load port 120 in the wafer processing system 100.

As shown in FIG. 3B, the cassette support 325 comprises a top surface 331 configured to support thereon a cassette with wafers contained therein, and a plurality of sidewalls 332 extending around the top surface 331. As shown in FIG. 3A, the sidewalls 332 extend upwardly and obliquely from the top surface 331. On a bottom surface 333 opposite to the top surface 331, the cassette support 325 comprises a plurality of hollow hubs 334, 335 having openings oriented downwardly. A rod 336 has an upper end 337 received in the corresponding hub 334 to couple the rod 336 to the cassette support 325. Similarly, a rod 338 has an upper end 339 receivable in the corresponding hub 335 to couple the rod 338 to the cassette support 325. In FIG. 3A, the rod 338 is illustrated in a state where the upper end 339 is not yet coupled or received in the corresponding hub 335. In at least one embodiment, the rods 336, 338 correspond to the first rods 227 or second rods 228, and have lower ends resting on corresponding sensors (not shown in FIG. 3A) as described with respect to FIG. 2. As shown in FIG. 3B, holes 344, 345 are formed at corner of the cassette support 325, from the top surface 331 to the bottom surface 333. Fasteners (not shown) are placed in the holes 344, 345 for securing the hollow hubs 334, 335, respectively, to the cassette support 325. The number and/or arrangement of the hollow hubs 334, 335 and the corresponding rods 336, 338 in FIGS. 3A-3B is/are an example. Other configurations are within the scope of various embodiments. For example, in at least one embodiment, the cassette support 325 has a single hollow hub on the bottom surface 333 for coupling to a single rod which transfers the load of a cassette placed on the cassette support 325 to a single sensor.

FIG. 3C is a schematic view of a sensor arrangement on cassette supports 365, 366 together with corresponding controllers, in accordance with some embodiments. In at least one embodiment, the cassette supports 365, 366 correspond to the cassette supports 225, 226. Each of the cassette supports 365, 366 having four sensors arranged at corners thereof. For example, sensors 371-374 of the cassette support 365 are arranged at the corners of the cassette support 365 as indicated by numbers 1, 2, 3, 4 in FIG. 3C. Sensors 381-384 of the cassette support 366 are arranged at the corners of the cassette support 366 as indicated by numbers 5, 6, 7, 8 in FIG. 3C. In at least one embodiment, the sensors 371-374 correspond to the sensors 231 as described with respect to FIG. 2, and/or are coupled to receive load from the cassette support 365 via a plurality of hollow hubs and rods, as described with respect to FIGS. 3A-3B. The sensors 381-384 correspond to the sensors 232 as described with respect to FIG. 2, and/or are coupled to receive load from the cassette support 366 via a plurality of hollow hubs and rods, as described with respect to FIGS. 3A-3B. The described sensor arrangement is an example. Other sensor arrangements are within the scope of various embodiments.

Figure 4:
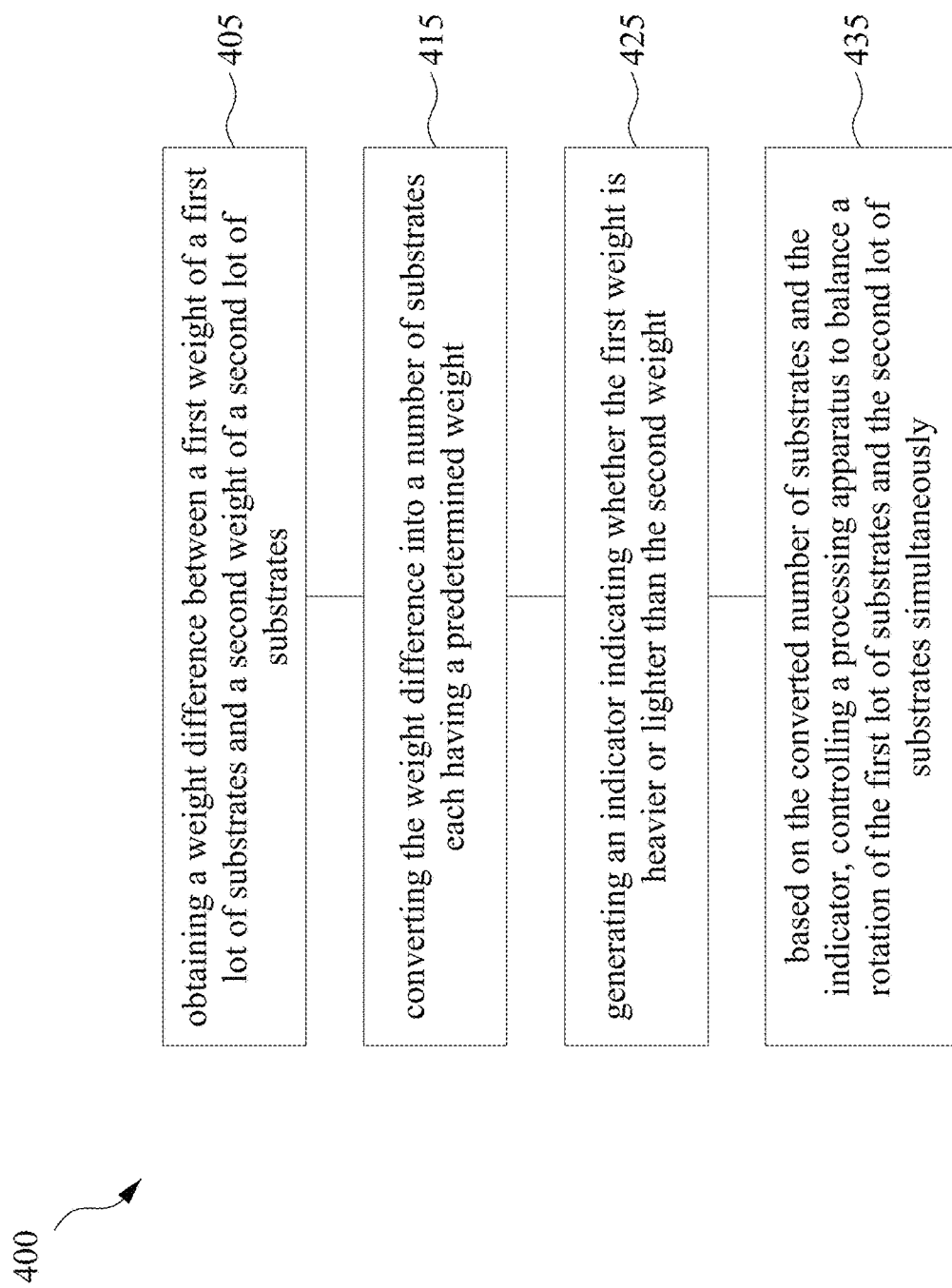
FIG. 4 is a flow chart of a method, in accordance with some embodiments.

FIG. 4 is a flow chart of a method 400, in accordance with some embodiments. In at least one embodiment, the method 400 is performed in the wafer processing system 100 or substrate processing system 200, and/or by the controller 150 or controller 250.

At operation 405, a weight difference between a first weight of a first lot of substrates and a second weight of a second lot of substrates is obtained. For example, a weight difference $\Delta W$ between a first weight of the first lot of wafers 221 and a second weight of the second lot of wafers 222 is obtained as $\Delta W=|W1-W2|$, as described with respect to FIG. 2.

At operation 415, the weight difference is converted into a number of substrates each having a predetermined weight. For example, the converted number of substrates $\Delta N$ is obtained by dividing the weight difference $\Delta W$ by the predetermined weight Wn, as described with respect to FIG. 2. In at least one embodiment, the converted number of substrates $\Delta N$ is output as a plurality of first bits, e.g., X1-X5.

At operation 425, an indicator indicating whether the first weight is heavier or lighter than the second weight is generated. For example, an indicator indicating whether the first lot of wafers 221 is heavier or lighter than the second lot of wafers 222 is output as a logic state of a second bit, e.g., X6, as described with respect to FIG. 2. In at least one embodiment, the logic state of X6 is generated by comparing W1 with W2, or based on a sign of the result of the subtraction W1-W2.

At operation 435, based on the converted number of substrates and the indicator, a processing apparatus is controlled to balance a rotation of the first lot of substrates and the second lot of substrates simultaneously. For example, as described with respect to FIG. 2, the PLC 254 receives the first bits X1-X5 representing the converted number of substrates $\Delta N$ and the second bit X6 representing the indicator, and uses the received information to control the actuator 248 to adjust positions of the counterweights 246, 247 with respect to the first lot of wafers 221 and second lot of wafers 222 mounted on the frame 241, to achieve rotational balancing in the spinning operation of the spin dryer 240.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 5:
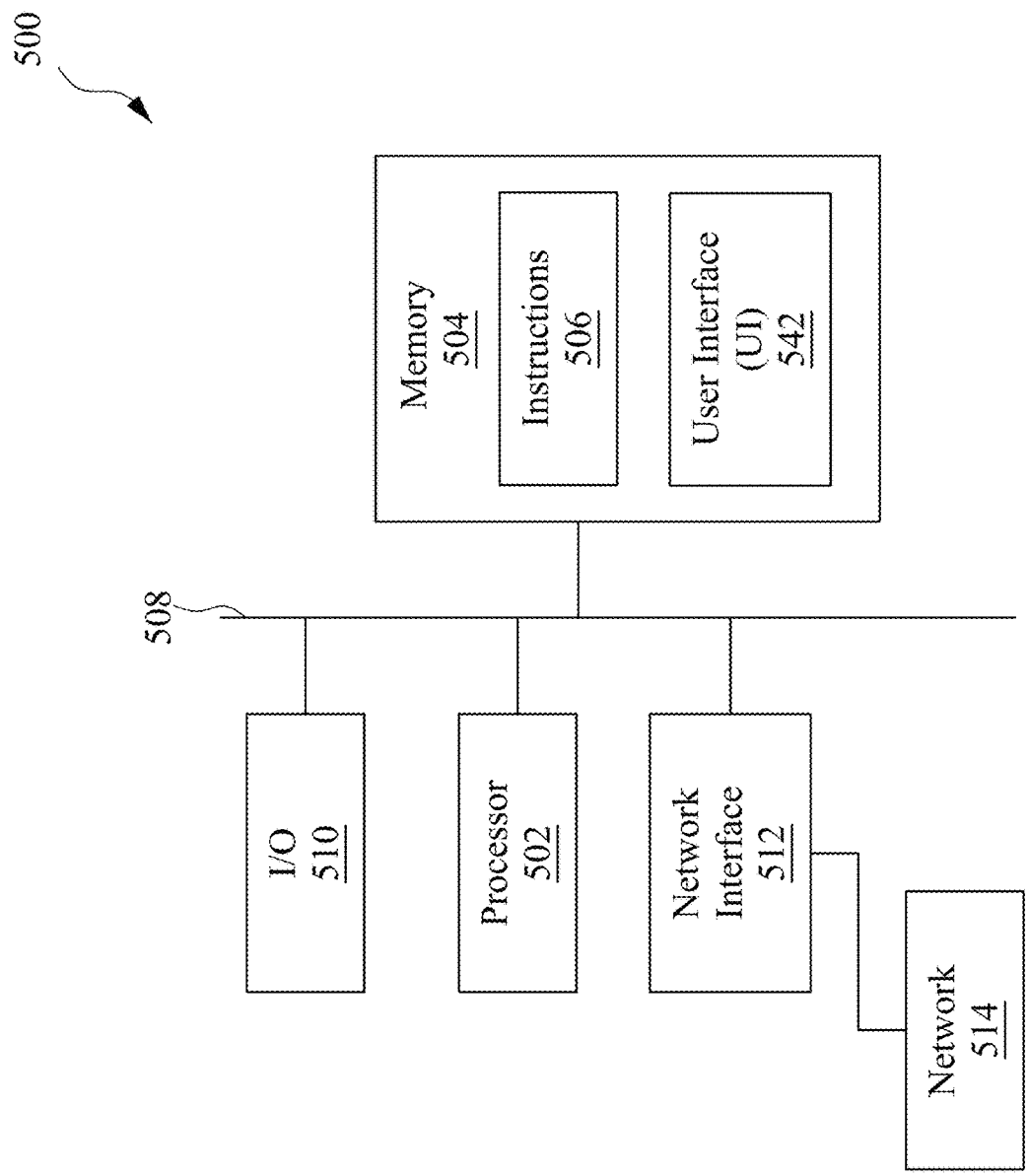
FIG. 5 is a block diagram of a controller, in accordance with some embodiments.

FIG. 5 is a block diagram of a controller 500 in accordance with some embodiments. In at least one embodiment, the controller 500 corresponds to one or more controllers, MCU or PLC described with respect to FIGS. 1-2.

In some embodiments, controller 500 is a general purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 implements a portion or all of, e.g., the methods and/or operations described herein in accordance with one or more embodiments.

Processor 502 is electrically coupled to computer-readable storage medium 504 via a bus 508. Processor 502 is also electrically coupled to an I/O interface 510 by bus 508. A network interface 512 is also electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 in order to cause controller 500 to perform a portion or all of the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

Controller 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

Controller 500 also includes network interface 512 coupled to processor 502. Network interface 512 allows controller 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364.

Controller 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. Controller 500 is configured to receive information related to a UI through I/O interface 510. The information is stored in computer-readable medium 504 as user interface (UI) 542.

Figure 6:
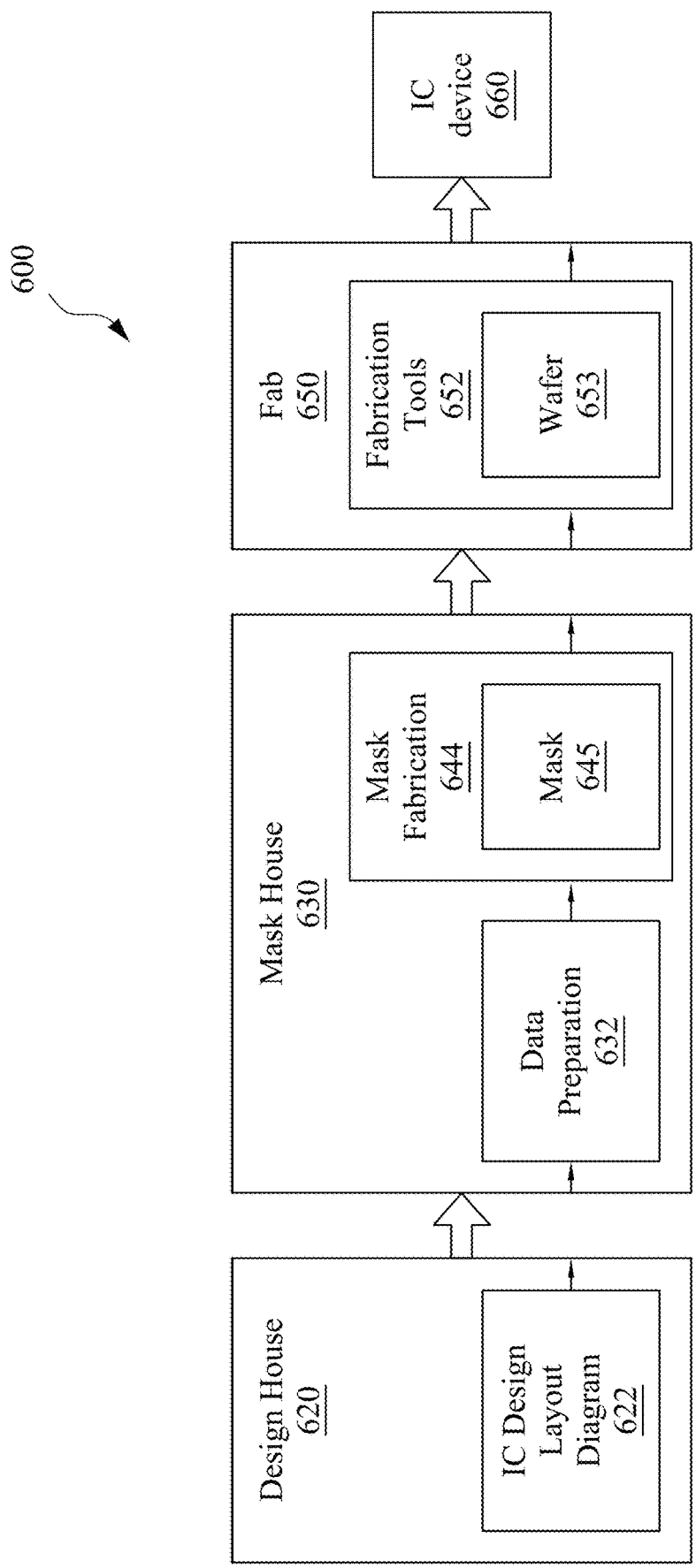
FIG. 6 is a block diagram of an IC manufacturing system and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design layout diagram 622. IC design layout diagram 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The design layout diagram 622 is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, data preparation 632 includes additional features such as a logic operation (LOP) to modify the IC design layout diagram 622 according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask. In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 includes fabrication tools 652 configured to execute various manufacturing operations on semiconductor wafer 653 such that IC device 660 is fabricated in accordance with the mask(s), e.g., mask 645. In various embodiments, fabrication tools 652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 650 uses mask(s) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multilevel interconnects, and the like (formed at subsequent manufacturing steps).

Details regarding an integrated circuit (IC) manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a system comprises at least one sensor and at least one controller. The at least one sensor is configured to generate a first weight signal corresponding to a first weight of a first lot of substrates, and a second weight signal corresponding to a second weight of a second lot of substrates. The at least one controller is coupled to the at least one sensor to receive the first weight signal and the second weight signal. The at least one controller is configured to convert a weight difference between the first weight and the second weight into a number of substrates each having a predetermined weight. The at least one controller is further configured to, based on the converted number of substrates, control a processing apparatus to rotate the first lot of substrates and the second lot of substrates simultaneously.

In some embodiments, a load port for a wafer processing system comprises first and second cassette supports, at least one first sensor, at least one second sensor, and a microcontroller (MCU). The first cassette support is configured to support thereon a first cassette containing a first lot of wafers. The at least one first sensor is coupled to the first cassette support and configured to generate a first weight signal corresponding to a first total weight of the first cassette and the first lot of wafers. The second cassette support is configured to support thereon a second cassette containing a second lot of wafers. The at least one second sensor is coupled to the second cassette support and configured to generate a second weight signal corresponding to a second total weight of the second cassette and the second lot of wafers. The MCU is coupled to the at least one first sensor and the at least one second sensor to receive the first weight signal and the second weight signal, respectively. The MCU is configured to convert a weight difference between the first total weight and the second total weight into a number of wafers each having a predetermined weight, generate an indicator indicating whether the first lot of wafers is heavier or lighter than the second lot of wafers, and output the indicator and the converted number of wafers to a controller of a processing apparatus of the wafer processing system to enable the controller to control the processing apparatus to balance a rotation of the first lot of wafers and the second lot of wafers simultaneously.

In a method in accordance with some embodiments, a weight difference between a first weight of a first lot of substrates and a second weight of a second lot of substrates is obtained. The weight difference is converted into a number of substrates each having a predetermined weight. An indicator indicating whether the first weight is heavier or lighter than the second weight is generated. Based on the converted number of substrates and the indicator, a processing apparatus is controlled to balance a rotation of the first lot of substrates and the second lot of substrates simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   at least one sensor configured to generate
      a first weight signal corresponding to a first weight of a first lot of substrates, and
      a second weight signal corresponding to a second weight of a second lot of substrates,
   at least one controller coupled to the at least one sensor to receive the first weight signal and the second weight signal, the at least one controller configured to
      convert a weight difference between the first weight and the second weight into a number of substrates each having a predetermined weight, and
      based on the converted number of substrates, control a processing apparatus to rotate the first lot of substrates and the second lot of substrates simultaneously.

2. The system of claim 1, wherein
the at least one controller is further configured to generate an indicator indicating whether the first weight is heavier or lighter than the second weight, and based on the indicator and the converted number of substrates, control the processing apparatus to rotate the first lot of substrates and the second lot of substrates simultaneously.

3. The system of claim 2, further comprising:
the processing apparatus,
wherein
the processing apparatus comprises a balancing mechanism, and
the at least one controller is configured to, based on the indicator and the converted number of substrates, control the balancing mechanism to balance a rotation of the first lot of substrates and the second lot of substrates simultaneously.

4. The system of claim 3, wherein
the balancing mechanism comprises at least one counterweight, and
the at least one controller is configured to, based on the indicator and the converted number of substrates, control the balancing mechanism to move the at least one counterweight relative to at least one of the first lot of substrates or the second lot of substrates, for balancing the rotation of the first lot of substrates and the second lot of substrates simultaneously.

5. The system of claim 1, further comprising:
a first cassette support configured to support thereon a first cassette containing the first lot of substrates,
wherein the at least one sensor comprises at least one first sensor coupled to the first cassette support and configured to generate the first weight signal corresponding to a first total weight of the first cassette and the first lot of substrates.

6. The system of claim 5, further comprising:
a second cassette support configured to support thereon a second cassette containing the second lot of substrates,
wherein the at least one sensor further comprises at least one second sensor coupled to the second cassette support and configured to generate the second weight signal corresponding to a second total weight of the second cassette and the second lot of substrates.

7. The system of claim 6, wherein
the at least one first sensor comprises a plurality of first sensors,
the at least one second sensor comprises a plurality of second sensors,
the system further comprising:
a plurality of first rods each extending downwardly from a bottom of the first cassette support to a corresponding first sensor among the plurality of first sensors, the plurality of first rods configured to transfer a first load corresponding to the first total weight to the plurality of first sensors; and
a plurality of second rods each extending downwardly from a bottom of the second cassette support to a corresponding second sensor among the plurality of second sensors, the plurality of second rods configured to transfer a second load corresponding to the second total weight to the plurality of second sensors.

8. The system of claim 6, wherein the system is a wafer processing system comprising:
a plurality of processing apparatuses, including the processing apparatus which is a spin dryer;
a housing in which the plurality of processing apparatuses is accommodated; and a load port configured to load the first lot of substrates and the second lot of substrates into the housing for processing by one or more of the plurality of processing apparatuses,
wherein the load port comprises the first cassette support, the second cassette support, the at least one first sensor, and the at least one second sensor.

9. The system of claim 6, wherein the at least one controller comprises:
an analog-to-digital converter (ADC) configured to
convert the first weight signal into first weight data corresponding to the first weight, and
convert the second weight signal into second weight data corresponding to the second weight; and
a processing circuitry coupled to the ADC to receive the first weight data and the second weight data, the processing circuitry configured to
generate a plurality of first bits corresponding to the converted number of substrates, and
generate a second bit, wherein a first logic state of the second bit indicates that the first weight is heavier than the second weight, and an opposite, second logic state of the second bit indicates that the first weight is lighter than the second weight.

10. The system of claim 9, wherein the at least one controller comprises:
a microcontroller (MCU) comprising the ADC and the processing circuitry; and
a programmable logic controller (PLC) coupled to the MCU to receive the plurality of first bits and the second bit, the PLC configured to, based on the plurality of first bits and the second bit, control the processing apparatus to balance a rotation of the first lot of substrates and the second lot of substrates simultaneously.

11. A load port for a wafer processing system, the load port comprising:
a first cassette support configured to support thereon a first cassette containing a first lot of wafers;
at least one first sensor coupled to the first cassette support and configured to generate a first weight signal corresponding to a first total weight of the first cassette and the first lot of wafers;
a second cassette support configured to support thereon a second cassette containing a second lot of wafers;
at least one second sensor coupled to the second cassette support and configured to generate a second weight signal corresponding to a second total weight of the second cassette and the second lot of wafers; and
a microcontroller (MCU) coupled to the at least one first sensor and the at least one second sensor to receive the first weight signal and the second weight signal, respectively, the MCU configured to
convert a weight difference between the first total weight and the second total weight into a number of wafers each having a predetermined weight,
generate an indicator indicating whether the first lot of wafers is heavier or lighter than the second lot of wafers, and
output the indicator and the converted number of wafers to a controller of a processing apparatus of the wafer processing system to enable the controller to control the processing apparatus to balance a rotation of the first lot of wafers and the second lot of wafers simultaneously.

12. The load port of claim 11, further comprising:
at least one first rod extending downwardly from a bottom of the first cassette support to the at least one first sensor, the at least one first rod configured to transfer a first load corresponding to the first total weight to the at least one first sensor; and at least one second rod extending downwardly from a bottom of the second cassette support to the at least one second sensor, the at least one second rod configured to transfer a second load corresponding to the second total weight to the at least one second sensor.

13. The load port of claim 12, wherein
the first cassette support comprises, on the bottom thereof, at least one first hollow hub in which an upper end of the at least one first rod is received to couple the at least one first rod to the first cassette support, and
the second cassette support comprises, on the bottom thereof, at least one second hollow hub in which an upper end of the at least one second rod is received to couple the at least one second rod to the second cassette support.

14. The load port of claim 12, further comprising:
a platform over which the first cassette support and the second cassette support are arranged,
wherein the at least one first rod and the at least one second rod extend downwardly from the bottoms of the first cassette support and the second cassette support, respectively, through the platform, to the at least one first sensor and the at least one second sensor, respectively.

15. The load port of claim 11, wherein the MCU comprises:
an analog-to-digital converter (ADC) configured to convert the first weight signal into first weight data corresponding to the first total weight, and
convert the second weight signal into second weight data corresponding to the second total weight; and
a processing circuitry coupled to the ADC to receive the first weight data and the
second weight data, the processing circuitry configured to generate a plurality of first bits corresponding to the converted number of wafers, and
generate a second bit, wherein a first logic state of the second bit indicates that the first lot of wafers is heavier than the second lot of wafers, and an opposite, second logic state of the second bit indicates that the first lot of wafers is lighter than the second lot of wafers.

16. A method, comprising:
obtaining a weight difference between a first weight of a first lot of substrates and a second weight of a second lot of substrates;
converting the weight difference into a number of substrates each having a predetermined weight;
generating an indicator indicating whether the first weight is heavier or lighter than the second weight; and
based on the converted number of substrates and the indicator, controlling a processing apparatus to balance a rotation of the first lot of substrates and the second lot of substrates simultaneously.

17. The method of claim 16, wherein
said controlling comprises moving at least one counterweight of a balancing mechanism of the processing apparatus
toward the first lot of substrates mounted in the processing apparatus in response to the indicator indicating that the first weight is lighter than the second weight, and
toward the second lot of substrates mounted in the processing apparatus in response to the indicator indicating that the first weight is heavier than the second weight, and
as a result of said moving, the at least one counterweight is moved a distance corresponding to the converted number of substrates.

18. The method of claim 16, wherein
an actual weight of a first substrate in the first lot of substrates is different from at least one of
the predetermined weight, or
an actual weight of a second substrate in the second lot of substrates.

19. The method of claim 16, wherein said obtaining the weight difference comprises:
detecting, by at least one first sensor, a first total weight of a first cassette containing the first lot of substrates and the first weight of the first lot of substrates;
detecting, by at least one second sensor, a second total weight of a second cassette containing the second lot of substrates and the second weight of the second lot of substrates; and
subtracting the first total weight from the second total weight and adopting a result of said subtracting as the weight difference between the first weight of the first lot of substrates and the second weight of the second lot of substrates.

20. The method of claim 16, wherein
said converting comprises:
dividing the weight difference by the predetermined weight, regardless of whether the predetermined weight is an actual weight of any substrate in the first lot of substrates or the second lot of substrates, and
rounding a result of said dividing to obtain the converted number of substrates, said method further comprising:
inputting, into a controller of the processing apparatus,
a plurality of first bits corresponding to the converted number of substrates, and
a second bit, wherein a first logic state of the second bit indicates that the first weight is heavier than the second weight, and an opposite, second logic state of the second bit indicates that the first weight is lighter than the second weight.

* * * * *